United States Patent
Kawasaki

(10) Patent No.: US 6,240,006 B1
(45) Date of Patent: May 29, 2001

(54) SEMICONDUCTOR MEMORY DEVICE HAVING REDUCED INTERCONNECTION RESISTANCE

(75) Inventor: Satoshi Kawasaki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/250,170

(22) Filed: Feb. 16, 1999

(30) Foreign Application Priority Data

Jun. 10, 1998 (JP) .................................................. 10-162478

(51) Int. Cl.[7] ......................................................... G11C 7/00
(52) U.S. Cl. ............................ 365/63; 365/164; 365/214; 365/174
(58) Field of Search ................................. 365/63, 230.01, 365/164, 214, 174

(56) References Cited

U.S. PATENT DOCUMENTS

| | | | |
|---|---|---|---|
| 5,870,348 | * | 2/1999 | Tomishima et al. ............. 365/230.06 |
| 5,953,261 | * | 9/1999 | Furutani et al. ................. 365/189.05 |

FOREIGN PATENT DOCUMENTS

| | | | | |
|---|---|---|---|---|
| 358018959A | * | 2/1983 | (JP) | ...................................... 257/390 |
| 8-172169 | | 7/1996 | (JP) | . |
| 411354745A | * | 12/1999 | (JP) | ............................. H01L/27/108 |

* cited by examiner

Primary Examiner—Viet Q. Nguyen
(74) Attorney, Agent, or Firm—McDermott, Will & Emery

(57) ABSTRACT

Main word lines are shifted in the width direction in a memory array to generate an empty region formed by a shift-aside region. The width of a conductive interconnection line transmitting a desired signal/voltage is increased in this region. Accordingly, the width of the signal/voltage interconnection line is increased to reduce the resistance without increase in the array occupation area.

9 Claims, 11 Drawing Sheets

SEMICONDUCTOR MEMORY DEVICE HAVING REDUCED INTERCONNECTION RESISTANCE

BACKGROUND OF THE INVENTION

1. Field of the Invention

The present invention relates to a semiconductor memory device, particularly to an interconnection structure for reducing the resistance of interconnection lines arranged on a memory mat without increasing a memory mat area. The present invention more particularly relates to an interconnection structure for decreasing the resistance of interconnection lines located at the same layer as that of an interconnection line transmitting a memory cell selection signal.

2. Description of the Background Art

FIG. 17 schematically shows an entire structure of a conventional semiconductor memory device. In FIG. 17, a memory mat 1 having a plurality of memory cells MCs arranged in rows and columns is divided into a plurality of memory blocks MB#0–MB#n in a row direction. In each of memory blocks MB#0–MBn, a plurality of sub word lines SWLs placed corresponding to respective rows of memory cells MCs and having memory cells MCs of corresponding rows connected thereto, and a bit line pair BLP placed corresponding to each column of memory cells and having corresponding memory cells connected thereto are provided. FIG. 17 illustrates representatively one sub word line SWL, one bit line pair BLP, and a memory cell MC arranged corresponding to a crossing of sub word line SWL and bit line pair BLP.

A main word line MWL extending in the row direction is commonly provided to memory blocks MB#0–MB#n. Main word line MWL is arranged corresponding to a prescribed number of sub word lines in each of memory blocks MB#0–MB#, with the prescribed number being one or more. A sub word line driver SWD is placed corresponding to each sub word line SWL. Each sub word line driver SWD drives a corresponding sub word line SWL into a selected state according to at least a signal potential on a corresponding main word line MWL. If main word line MWL is arranged corresponding to each row of memory blocks MB#0–MB#n, sub word line driver SWD drives a corresponding sub word line SWL into a selected state according to a signal potential on the corresponding main word line MWL. If main word line MWL is arranged corresponding to memory cells of a plurality of rows in memory mat 1, sub word line driver SWD drives a corresponding sub word line SWL into a selected state according to a signal potential on the corresponding main word line MWL and a row address predecode signal (as discussed below).

The semiconductor memory device further includes a row selection drive circuit 2 driving main word line MWL placed corresponding to an addressed row into a selected state according to an address signal (not shown), a bit line equalize circuit 3 setting bit line pair BLP at a prescribed voltage in a standby state, a sense amplifier circuit 4 including a sense amplifier provided corresponding to each bit line pair BLP and differentially amplifying potential on the corresponding bit line pair BLP in an activated state, and a column selection circuit 5 selecting a bit line pair placed corresponding to an addressed column according to a column address signal (not shown). In a standby state, main word line MWL is in a non-selected state, and sub word lines SWLs in each of memory blocks MB#0–MB#n are also in a non-selected state. Bit line pair BLP is set (precharged and equalized) at a level of a prescribed voltage (an intermediate voltage between power supply voltage Vcc and ground voltage Vss) by bit line equalize circuit 3 .

When a memory cell selection cycle (active cycle) is started, row selection drive circuit 2 first drives main word line MWL corresponding to an addressed row into a selected state. Sub word line driver SWD drives a corresponding sub word line SWL into a selected state according to at least a signal potential on main word line MWL when the corresponding sub word line SWL corresponds to the addressed row. In each of memory blocks MB#0–MB#n, sub word line SWL placed corresponding to the addressed row is driven into a selected state. Accordingly, data stored in memory cell MC is transmitted onto bit line pair BLP.

Sense amplifier circuit 4 is then activated, data of memory cell MC read onto bit line pair BLP is sensed, amplified and latched. Data is written into or read from bit line pair BLP that corresponds to a column selected by column selection circuit 5.

Word lines arranged corresponding to memory cell rows each have a hierarchical structure formed of main word line MWL commonly provided to a plurality of memory blocks MB#0–MB#n, and sub word line SWL to which memory cells MCs are connected in each of memory blocks MB#0–MB#n. It is possible to transmit a row select drive signal fiom row selection drive circuit 2 to the end of main word line MWL at a high speed since no memory cell MC is connected to main word line MWL. The number of memory cells MCs connected to sub word line SWL is small and accordingly the parasitic capacitance of sub word line is small. Therefore, the hierarchical structure of word lines formed of the main word lines and sub word lines allows a memory cell row to be driven into a selected state at a high speed even if the storage capacity of the semiconductor memory device is increased and the number of memory cells of one row increases.

FIG. 18 shows one example of a structure of sub word line driver SWD illustrated in FIG. 17. FIG. 18 shows sub word line drivers provided to a memory block MB#i (i=0-n). One main word line MWL is arranged corresponding to sub word lines SWLa–SWLd placed corresponding to 4 rows of memory cells in memory block MB#i. Sub word line drivers SWDa–SWDd are arranged corresponding to respective sub word lines SWLa–SWLd.

Sub word line drivers SWDa–SWDd are respectively enabled when a signal potential on main word line MWL is at a logical high or H level indicating a selected state, and drive corresponding sub word lines SWLa–SWLd into a selected state respectively according to row predecode signals Ra–Rd. One of row predecode signals Ra–Rd is driven into a selected state to designate one of sub word lines SWLa–SWLd.

The arrangement shown in FIG. 18 allows one main word line MWL to be placed corresponding to memory cells of 4 rows to relax the pitch condition of main word lines MWLs. Consequently, main word line MWL can be arranged with a sufficient margin.

As an alternative to the structure shown in FIG. 18, decoders respectively enabled in response to a signal potential on main word line MWL to transmit row predecode signals Ra–Rd to corresponding sub word lines SWLa–SWLd may replace sub word line drivers SWDa–SWDd.

FIG. 19A schematically shows a structure of one memory block of the semiconductor memory device illustrated in FIG. 17. FIG. 19A shows a structure of a portion related to memory cells MCs arranged in two columns.

In FIG. 19A, memory block MB#i includes a plurality of memory cells MCs arranged in rows and columns, sub word lines SWLa, SWLB, . . . arranged corresponding to respective memory cell rows and having memory cells MCs of corresponding rows connected thereto, and a plurality of bit line pairs BLPa . . . BLPm arranged corresponding to respective memory cell columns and having memory cells of corresponding columns connected thereto. Bit line pair BLPa includes bit lines BLa and /BLa, and bit line pair BLPm includes bit lines BLm and /BLm. Memory cells MCs are arranged corresponding to crossings of bit line pairs BLPa . . . BPLm and sub word lines SWLa, SWLb, . . . FIG. 19A illustrates memory cells MCs arranged corresponding to respective crossings of sub word line SWLa and bit lines BLa and BLm, and memory cells MCs arranged corresponding to crossings of sub word line SWLb and bit lines /BLa and /BLm respectively.

Memory cell MC includes a memory capacitor MQ storing information, and an access transistor MT responsive to a signal potential on a corresponding sub word line SWL (SWLa or SWLb) to become conductive to connect memory capacitor MQ to a corresponding bit line BL (BLa, BLm) or /BL (/BLa, /BLm).

Memory capacitor MQ accumulates charge according to storage data on a storage node SN connected to access transistor MT, and receives a constant cell plate voltage Vcp at its cell plate electrode.

Bit line equalize circuit 3 includes bit line equalize/precharge circuits 3a . . . 3m provided corresponding to respective bit line pairs BLPa . . . BLPm. Bit line equalize/precharge circuits 3a–3m each have the same structure, and FIG. 19A representatively shows a specific structure of bit line equalize/precharge circuit 3a provided to bit line pair BLPa. Bit line equalize/precharge circuit 3a includes an n channel MOS transistor Q1 responsive to a bit line equalize instruction signal φBLEQ to electrically short-circuit bit lines BLa and /BLa, and n channel MOS transistors Q2 and Q3 responsive to activation of bit line equalize instruction signal φBLEQ to become conductive to transmit a prescribed precharge voltage Vb1 onto bit lines BLa and /BLa.

Sense amplifier circuit 4 includes sense amplifiers (Sas)4a . . . 4m provided corresponding to respective bit line pairs BLPa . . . BLPm, activated in response to activation of a sense amplifier activation signal φSA, differentially amplifying and latching signal potential on bit line pairs BLPa . . . BLPm. Sense amplifiers (SAs) 4a–4m each include cross-coupled p channel MOS transistors and cross-coupled n channel MOS transistors.

Column selection circuit 5 includes IO gates 5a . . . 5m arranged corresponding to respective bit line pairs BLPa . . . BLPm, and rendered conductive in response to column selection signals YSa . . . Ysm to connect corresponding bit line pairs BLPa . . . BLPm to an internal data bus I/O. Referring now to FIG. 19B, an operation of the semiconductor memory device shown in FIG. 19A is described.

In a standby state, an array activation signal ACT is at a logical low or L level, and bit line equalize instruction signal φBLEQ is at H level. In this state, bit line equalize/precharge circuits 3a–3m are in an active state, precharge and equalize bit line pairs BLPa–BLPm to the level of precharge voltage Vb1. Sub word line SWL (SWLa, SWLb, . . . ) is set at the L level of a non-selected state, and sense amplifier activation signal φSA is also at the L level of a non-selected state. Array activation signal ACT is a signal which is internally activated when a memory cell row selection instruction signal is externally supplied, and corresponds to an internal row address strobe signal in a standard DRAM (Dynamic Random Access Memory).

The sense amplifier activation signal includes a signal activating an N sense amplifier section formed of n channel MOS transistors and a signal activating a P sense amplifier section formed of p channel MOS transistors respectively. FIG. 19B collectively shows them as one sense amplifier activation signal φSA.

When the array activation instruction signal (external row address strobe signal or an active command) driving a memory cell row into a selected state is supplied, array activation signal ACT is set into an active state, bit line equalize instruction signal φBLEQ accordingly falls to L level, bit line equalize/precharge circuits 3a–3m are set into an inactive state, and accordingly an equalize/precharge operation for bit line pairs BLPa–BLPm is completed. In this state, bit line pairs BLPa–BLPm are brought into the floating state at precharge voltage Vb1.

The potential on sub word line SWL placed corresponding to an addressed row then rises and data stored in memory cell MC connected to the selected sub word line SWL is transmitted to a corresponding bit line. FIG. 19B representatively illustrates bit lines BL and /BL and illustrates a signal waveform of the bit lines when storage data of the H level is read. Bit lines BL and /BL form a pair to be placed. When memory cell data is read onto one of bit lines BL and /BL, the other bit line keeps the level of precharge voltage Vb1.

When the potential difference between bit lines BL and /BL becomes sufficiently large, sense amplifier activation signal φSA is activated and sense amplifiers 4a–4m are activated to differentially amplify memory cell data read onto bit line pairs BLPa–BLPm respectively. Accordingly, the potential on bit line pairs BLPa–BLPm is set at the levels of power supply voltage Vcc and the ground voltage according to the read data.

After the sense amplifier operation is completed, data is written into or read from a selected column via IO gates 5a–5m shown in FIG. 19A according to column selection signals YSa–YSm.

In the hierarchical word line structure, a row selection signal is transmitted through the main word line to transfer the row selection signal to the end of the memory mat at a high speed, in order to drive word lines into a selected state at a high speed. However, when a word line (including both of the main word line and the sub word line) is driven into a selected state, the signal potential on sub word line SWL cannot be raised before bit line equalize instruction signal φBLEQ is driven into a non-selected state. When the potential on sub word line SWL increases during activation of bit line equalize/precharge circuits 3a–3m , data in a selected memory cell is destructed In order to drive the word lines into a selected state at a high speed, bit line equalize instruction signal φBLEQ should be driven into a non-selected state as soon as possible.

In addition, after a memory cycle is completed and array activation signal ACT is in an inactive state, bit line equalize instruction signal φBLEQ should be driven into an active state at a high speed. The reason is that if it takes much time to equalize the bit lines, the RAS precharge period increases and the word lines cannot be successively driven into a selected state at a high speed.

To a signal line transmitting bit line equalize instruction signal φBLEQ, the gates of transistors included in the bit line equalize/precharge circuits provided to respective bit line pairs are connected, and accordingly a large gate capacitance is connected thereto. In order to drive the large parasitic capacitance at a high speed, the signal line transmitting bit line equalize instruction signal φBLEQ is formed of, for example, a first level aluminum interconnection layer having a low resistance. The RC delay is thus reduced to activate/inactivate the bit line equalize/precharge circuits at a high speed.

FIG. 20 schematically shows a layout of interconnection lines of the conventional semiconductor memory device. Referring to FIG. 20, interconnection lines 10 of the first level aluminum interconnection layer constituting main word lines MWLs and extending in the row direction are arranged in memory mat. The first level aluminum interconnection lines 10 have the same width L and the same space (interval) S therebetween to make the RC delay in all main word lines MWLs equal. Conductive interconnection lines 10 are extended in the row direction in a straight form for transmitting signals at a high speed with a minimum interconnection length.

Between a sense amplifier arranging region 11 and memory mat 1, a conductive interconnection line 12 formed of the first level aluminum interconnection line for transmitting cell plate voltage Vcp, and a conductive interconnection line 13 for transmitting bit line equalize instruction signal φBLEQ are arranged to extend in the row direction. Conductive interconnection line 12 transmitting cell plate voltage Vcp is electrically connected to a cell plate node at a lower layer in an appropriate region. Conductive interconnection line 13 transmitting bit line equalize instruction signal φBLEQ should have a width as large as possible in order to transmit bit line equalize instruction signal φBLEQ at a high speed.

As shown in FIG. 21 illustrating a cross sectional structure along line 20A—20A of FIG. 20, interconnection line 10 constituting main word line MWL, conductive interconnection line 12 transmitting cell plate voltage Vcp, and conductive interconnection line 13 transmitting bit line equalize instruction signal φBLEQ are all formed at the same first level aluminum interconnection layer (1Al). Therefore, the width of conductive interconnection line 13 transmitting bit line equalize instruction signal φBLEQ cannot be increased without affecting the layout of sense amplifier arranging region 11 since the minimum space between those interconnection lines is determined in view of an inter-line capacitance and the like. If the width of conductive interconnection line 13 is increased to reduce the resistance thereof, the layout of the sense amplifier arranging region 11 is affected and equivalently conductive interconnection line 13 and sense amplifier arranging region 11 occupy a larger area. In particular, if the memory mat is divided into a plurality of row blocks in the column direction and the sense amplifiers are arranged between row blocks adjacent to each other, the equivalently increased area of the sense amplifier arranging region increases the memory mat area and accordingly the chip size.

Sense amplifiers placed in the sense amplifier arranging region are provided to respective bit line pairs and have to drive the bit line pairs BLPa–BLPm at high speed.

FIG. 22 illustrates one example of a structure of a sense amplifier SA included in the sense amplifier circuit. Referring to FIG. 22, sense amplifier SA includes p channel MOS transistors PQa and PQb having the gates and drains cross-coupled to each other, a p channel MOS transistor PQc rendered conductive in response to activation (L level) of a P sense activation signal φSP and transmitting power supply voltage Vcc on a sense power supply line 14 to the sources of p channel MOS transistors PQa and PQb, n channel MOS transistors NQa and NQb having the gates and drains cross-coupled to each other, and an n channel MOS transistor NQc rendered conductive in response to activation (H level) of an N sense activation signal φSN, and transmitting ground voltage Vss on a sense ground line 15 to the sources of MOS transistors NQa and NQb.

MOS transistors PQa and PQb have drains respectively connected to bit lines BL and /BL, and MOS transistors NQa and NQb have drains respectively connected to bit lines BL and /BL.

In the structure of sense amplifier SA shown in FIG. 22, when MOS transistor PQc is activated, current is supplied from sense power supply line 14 to one of bit lines BL and /BL at a higher potential by MOS transistors PQa and PQb to drive the bit line at the higher potential to the level of power supply voltage Vcc. One of bit lines BL and /BL at a lower potential is driven to the level of ground voltage Vss on sense ground line 15 by MOS transistors NQa–NQc.

Sense power supply line 14 and sense ground line 15 are commonly provided to sense amplifiers arranged in sense amplifier arranging region (see FIG. 20). Therefore, sense power supply line 14 and sense ground line 15 should supply current stably in order to charge and discharge a large number of bit lines. When the sense amplifier circuit operates, many sense amplifiers SAs simultaneously operate to cause a large amount of bit line charging/discharging current to flow. If the voltage levels on sense power supply line 14 and sense ground line 15 vary due to the bit line charging/discharging current, a high speed sensing operation is impossible to delay the data access timing. Therefore, in order to supply current stably for charging and discharging of the bit lines in the sense operation, the resistance of sense supply line 14 and sense ground line 15 should be reduced as much as possible, and power supply voltage Vcc and ground voltage Vss should be stably kept.

However, if the widths of sense power supply line 14 and sense ground line 15 placed in sense amplifier arranging region 11 in FIG. 20 are increased, the area of sense amplifier arranging region 11 accordingly increases. The reason is that sense power supply line 14 and sense ground line 15 are formed at the first level aluminum interconnection layer as the conductive interconnection lines shown in FIG. 21. If sense power supply line 14 and sense ground line 15 are formed at a second level aluminum interconnection layer, confliction of interconnection lines occurs since a column selection line transmitting column selection signals YSa–YSm shown in FIG. 19A is also formed at the second level aluminum interconnection layer. Therefore, sense power supply line 14 and sense ground line 15 cannot be arranged at the second level aluminum interconnection layer.

The problem associated with the bit line equalize instruction signal also arises if the word lines have a word line shunt structure where a normal polysilicon word line and an interconnection line having a low resistance and located at an upper layer are electrically connected in a word line shunt region, instead of the hierarchical word line structure formed of the main word line/sub word line.

SUMMARY OF THE INVENTION

An object of the present invention is to provide a semiconductor memory device that achieves a dramatically reduction of an interconnection resistance without increase of a memory mat area.

Another object of the present invention is to provide a semiconductor memory device that achieves a further reduction of the resistance of a low-resistance conductive interconnection line arranged in a sense amplifier band region.

Further object of the present invention is to provide a semiconductor memory device that achieves reinforcing of a sense power supply without increase of a memory mat occupation area.

In summary, according to the present invention, a signal interconnection line arranged on a memory array and transmitting a memory cell selection signal is shifted in a width direction to produce an empty region on the memory array, securing a region for placing an interconnection line to be arranged and increasing a width of the interconnection line to be arranged.

The empty region is generated on the memory array region by shifting a cell selection signal transmission line in the width direction on the memory cell array. A signal/voltage interconnection line is expanded to the empty region to enable the width of the signal/voltage interconnection line to be increased without increase of the area of the memory array. Accordingly, the interconnection resistance can be reduced and a desired signal/voltage can be transmitted stably at a high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
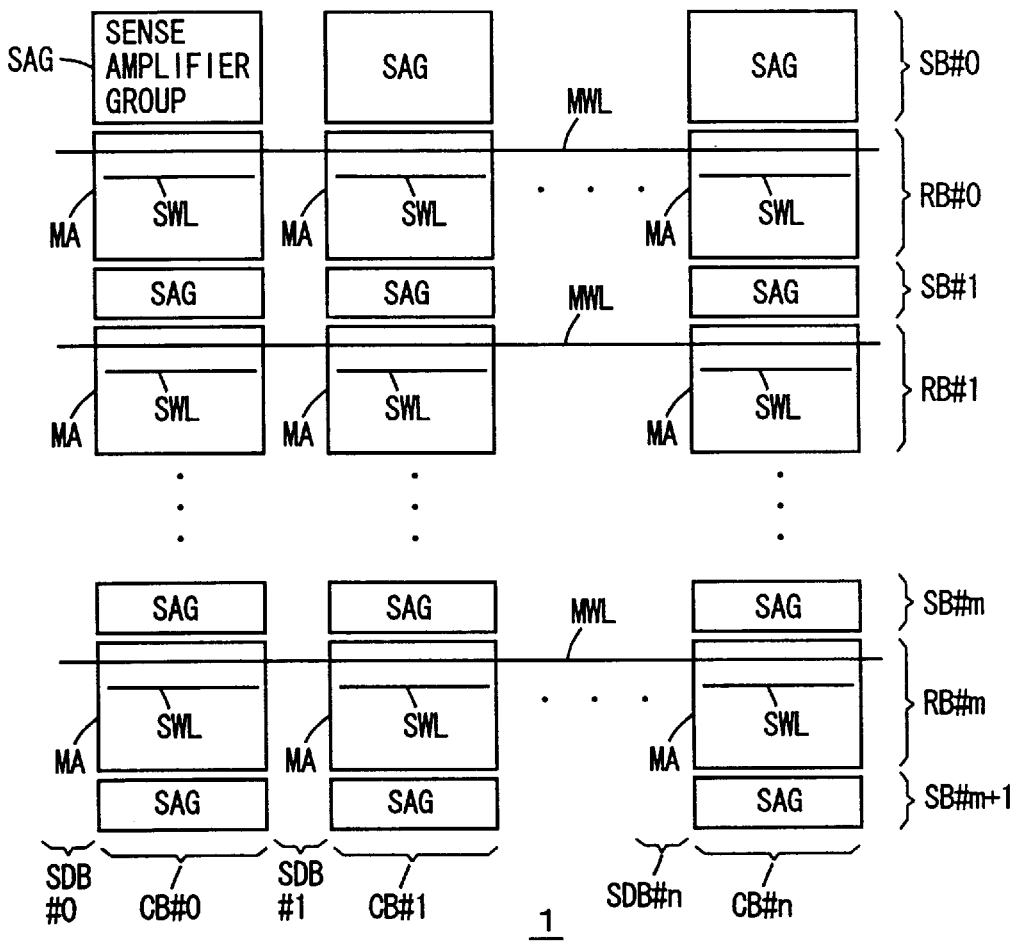
FIG. 1 schematically shows a structure of an array portion of a semiconductor memory device according to the present invention.

FIG. 1 schematically shows a structure of a memory mat of a semiconductor memory device used in the first embodiment of the present invention. Referring to FIG. 1, a memory mat 1 is divided into a plurality of memory arrays MAs in row and column directions. Memory arrays MAs arranged to be aligned in the row direction constitute a row block RB#i (i=0–m), and memory arrays MAs arranged to be aligned in the column direction constitute a column block CB#j (j=0–n). In each of memory arrays MAs, a sub word line SWL is arranged corresponding to each row of memory cells. Memory cells arranged on a corresponding row in a corresponding memory array MA are connected to the sub word line SWL.

A main word line MWL is arranged commonly to memory arrays MAs included in row block RB#i. Main word line MWL is arranged corresponding to a prescribed number of rows (sub word lines) in each memory array MA in a corresponding row block RB#i.

Between memory arrays MAs adjacent to each other in the column direction, a sense amplifier group SAG is arranged. Sense amplifier group SAG has an alternately arranged shared sense amplifier structure, for example, and a sensing operation is performed by sense amplifier groups SAGs placed on both sides of a selected memory array (memory array including a selected memory cell). Sense amplifier group SAG is shared by memory arrays MAs adjacent to each other in the column direction.

Sense amplifier groups SAGs aligned in the row direction constitute a sense amplifier band SB#k (k=0–m+1). In the region of sense amplifier band SB#k, sense amplifier group SAG, a bit line equalize circuit and a bit line isolation gate discussed below are provided.

A sub word line driver (not clearly shown in FIG. 1) is arranged between memory arrays MAs adjacent to each other in the row direction. Sub word line driver arranging regions SDB#0–SDB#n are arranged corresponding to respective column blocks CB#0#CB#n. The sub word line driver is arranged in sub word line driver arranging regions SDB#0–SDB#n, and no memory cell is arranged therein.

Figure 2:
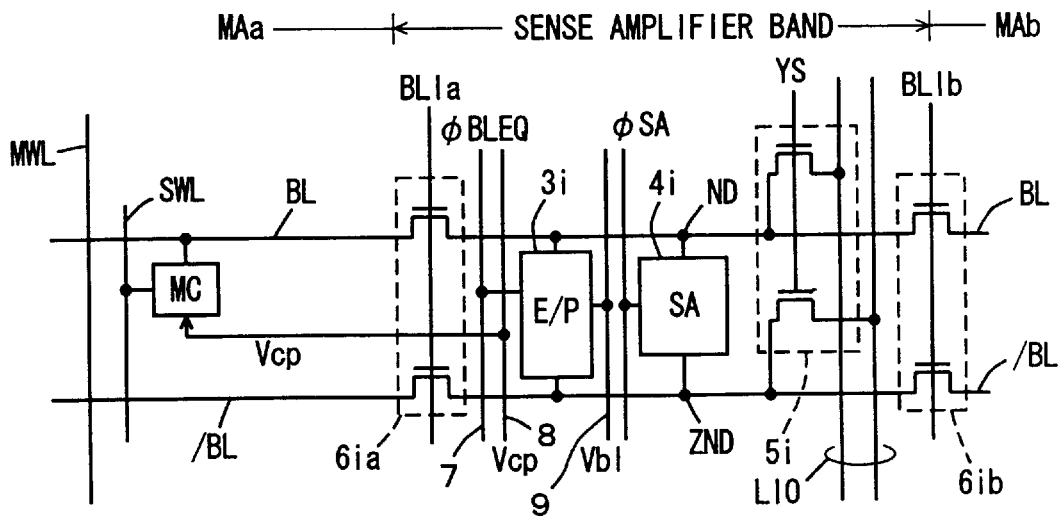
FIG. 2 schematically shows a structure of a sense amplifier band of the memory array shown in FIG. 1.

FIG. 2 schematically shows a structure of the sense amplifier band. FIG. 2 illustrates a structure of a portion corresponding to memory cells in one column in each of memory arrays MAa and MAb adjacent to each other in the column direction. Referring to FIG. 2, bit lines BL and /BL included in memory array MAa are respectively connected to nodes ND and ZND via a bit line isolation gate 6ia. Bit lines BL and /BL in memory array MAb are respectively connected to nodes ND and ZND via a bit line isolation gate 6ib. Bit line isolation gates 6ia and 6ib are respectively rendered conductive in response to bit line isolation instruction signals BLIa and BLIB. Bit line isolation instruction signals BLIa and BLIb are normally at H level, and bit line isolation instruction signal BLIB is brought to L level when memory array MAa includes a selected memory cell. When memory array MAb includes a selected memory cell, bit line isolation instruction signal BLIa is brought to L level.

Between nodes ND and ZND, a bit line equalize/precharge circuit (E/P) 3i is provided, which is activated in response to a bit line equalize instruction signal φBLEQ supplied via a signal line 7, to precharge and equalize bit lines BL and /BL in memory arrays MAa and MAb to the level of intermediate voltage Vb1 via bit line isolation gates 6ia and 6ib. Bit line equalize/precharge circuit 3i as a bit line potential setting circuit transmits intermediate voltage Vb1 supplied via an intermediate voltage transmission line 9 to corresponding bit lines BL and /BL in memory arrays MAa and MAb.

Figure 22:
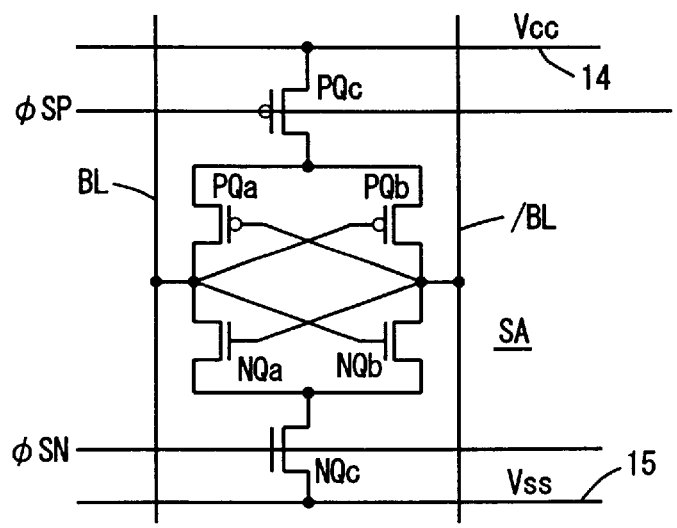
FIG. 22 schematically shows a structure of a sense amplifier of the conventional semiconductor memory device.

Between signal line 7 and bit line equalize/precharge circuit 3i, a cell plate line 8 supplying cell plate voltage Vcc to a capacitor (see FIG. 22) included in a memory cell MC is provided. Signal line 7 transmitting bit line equalize instruction signal φBLEQ and cell plate line 8 transmitting cell plate voltage Vcp are formed at the same interconnection layer, for example, formed of a first level aluminum interconnection layer.

A sense amplifier (SA) 4i activated in response to a sense amplifier activation signal φSA and differentially amplifying the potential on nodes ND and ZND is provided to nodes ND and ZND. The structure of sense amplifier 4i is similar to that shown in FIG. 22.

Further, an IO gate 5i rendered conductive in response to a column selection signal YS for connecting nodes ND and ZND to a local data bus LIO is provided to nodes ND and ZND. Local data bus LIO is commonly provided to memory arrays MAa and MAb. Local data bus LIO is usually arranged to extend in the row direction only in the region where memory arrays MAa and MAb are arranged.

Sub word line SWL is placed corresponding to main word line MWL in memory array MAa, and memory cell MC is arranged corresponding to a crossing of sub word line SWL and bit line BL. Main word line MWL is formed at the same interconnection layer as that of signal line 7 and cell plate line 8.

Figure 3:
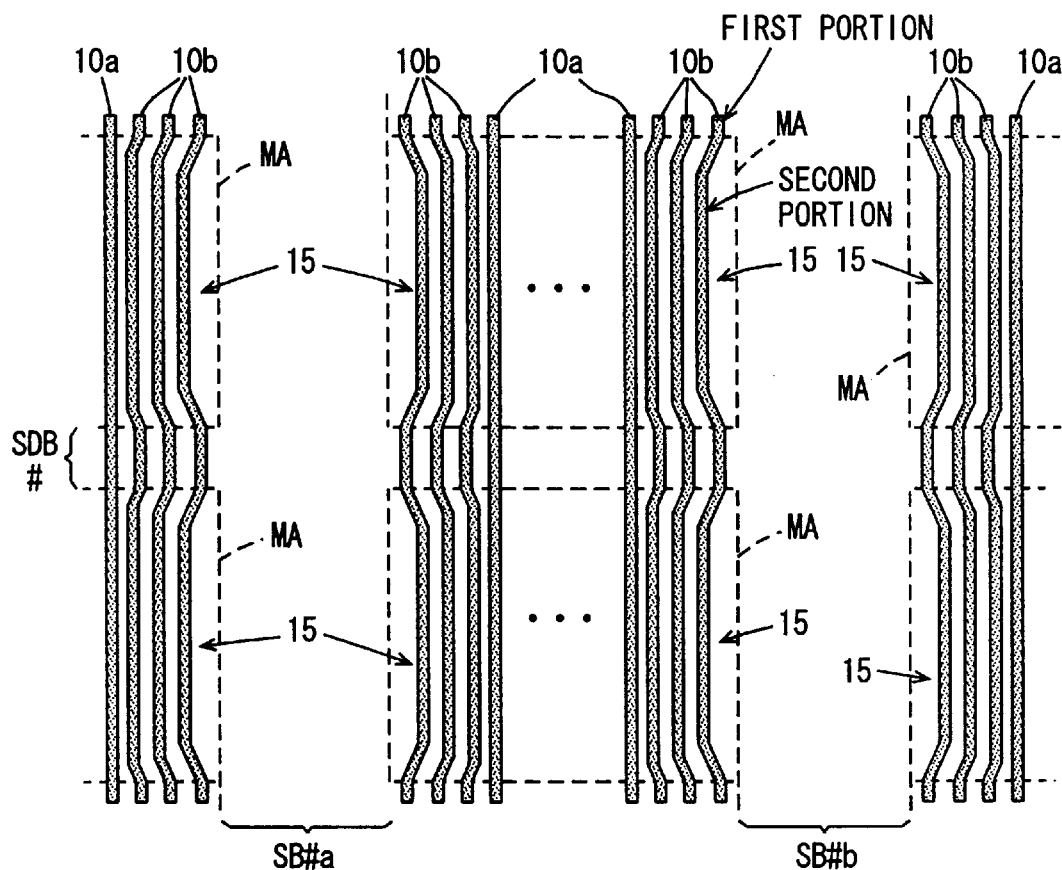
FIG. 3 schematically shows an arrangement of main word lines according to the first embodiment of the invention.

FIG. 3 schematically shows a layout of main word lines. Referring to FIG. 3, conductive interconnection lines forming main word lines MWLs are shifted aside in the direction of their widths in a central region relative to the row direction in each memory array MA. Specifically, interconnection lines forming main word lines MWLs include a conductive interconnection line 10a linearly extending in the row direction, and a conductive interconnection line 10b arranged in the vicinity of the peripheral portion of memory array MA and having "shift-aside structure" where the position of conductive interconnection line 10b is shifted in the column direction on the array. "Shift-aside structure" refers to a structure including a first portion extending in the row direction and a second portion arranged to be shifted in the column direction relative to the first portion. Conductive interconnection lines 10b have the width and space (inter-line distance) smaller than those of conductive interconnection lines 10a. For example, the width and space with respect to conductive interconnection line 10a are each 0.96 μm, and the width and space for conductive interconnection line 10b are each set to 0.91 μm. Suppose that provision of conductive interconnection lines 10b allows the width and space to be reduced by d, and the number of conductive interconnection lines 10b is a, conductive interconnection line 10b placed on the outermost side of memory array MA is shifted in the column direction by 2·a·d compared with the case in which conductive interconnection lines 10b are arranged linearly. Consequently, in each memory array MA, an empty region 15 is generated by "shift-aside". Empty region 15 is formed only on memory array MA and used as an interconnection expand region.

Conductive interconnection lines 10a and 10b are connected to sub word lines in a sub word line driver band SDB# where a sub word line driver between memory arrays MAs aligned in the row direction is placed. Therefore, conductive interconnection lines 10a and 10b are not shifted in the width direction and extended linearly in sub word line driver band SDB#, such that conductive interconnection lines 10a and 10b have the same width and space (e.g. 0.96 μm). As a result, empty region 15 can be formed by shifting conductive interconnection lines 10b in the width direction on memory array MA without adversely affecting the arrangement of the sub word line driver.

The circuit structure illustrated in FIG. 2 is provided to each of sense amplifier bands SB#a and SB#b located between memory arrays MAs adjacent to each other in the column direction. In sense amplifier bands SB#a and SB#b, signal line 7 transmitting bit line equalize instruction signal φBLEQ and cell plate line 8 transmitting cell plate voltage Vcp are arranged at the same layer as that of conductive interconnection lines 10a and 10b forming main word lines MWL. Any of those lines to be arranged has its line width expanded onto empty region 15. Accordingly, an interconnection line having a required feature can be arranged without increasing the length of sense amplifier bands SB#a and SB#b relative to the column direction.

Figure 20:
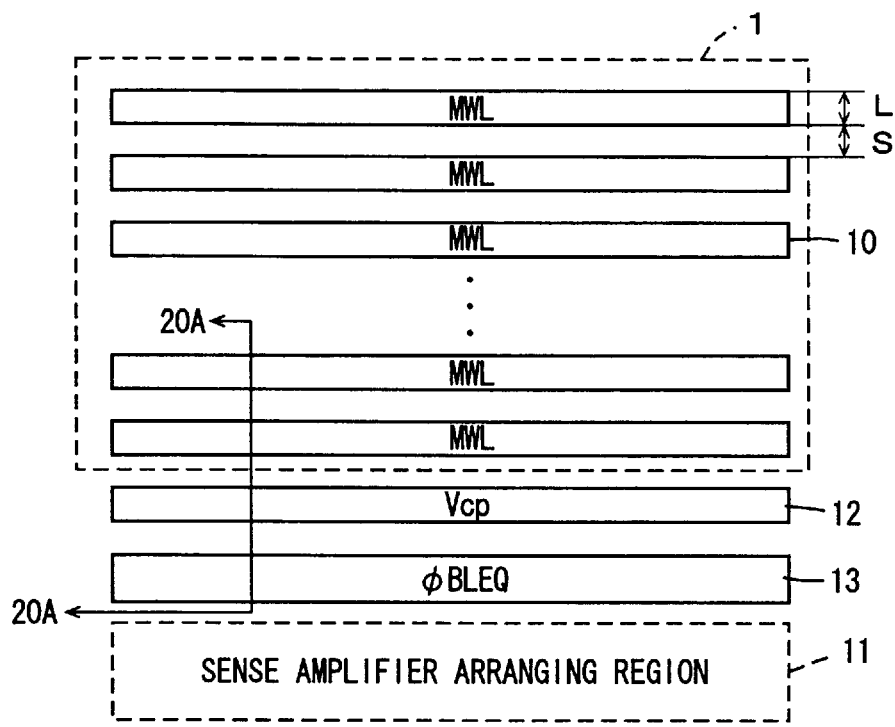
FIG. 20 is a schematic plan view of a layout of the conventional semiconductor memory device.
Figure 21:
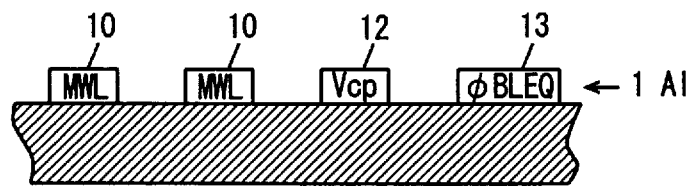
FIG. 21 schematically shows a cross sectional structure along line 20A—20A of FIG. 20.

The position of a part (the second portion) of conductive interconnection line 10b forming the main word line is just shifted in the column direction. Therefore, conductive interconnection line 10b is subject to a slight increase in the entire length, but almost no increase in RC (Resistance and Capacitance) delay. Accordingly, there is no propagation delay of a row selection signal to enable the sub word line to be driven into a selected state at a high speed similarly to that achieved by the interconnection lines shown in FIG. 20.

Figure 4:
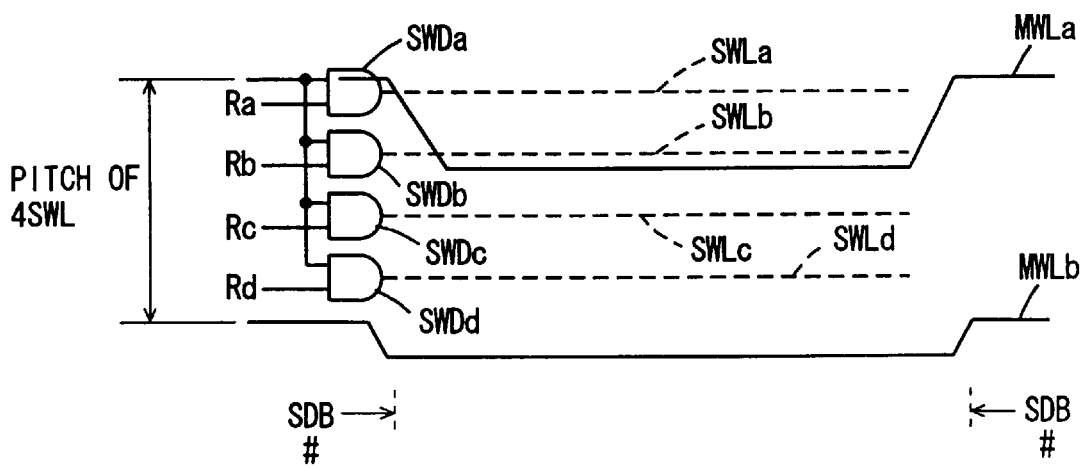
FIG. 4 schematically shows a correspondence between sub word lines and main word lines in the layout of main word lines shown in FIG. 3.

FIG. 4 schematically shows a correspondence between the main word line and the sub word line. Referring to FIG. 4, two main word lines MWLa and MWLb are constituted into the shift-aside structure where the positions of main word lines are shifted in the column direction. Sub word lines SWLa–SWLd are arranged corresponding to main word line MWLa. Main word line MWLa is coupled to sub word lines SWLa–SWLd via sub word line drivers SWDa–SWDd. Sub word line drivers SWDa–SWDd respectively drive corresponding sub word lines into a selected state according to row predecode signals Ra–Rd and the signal potential on main word line MWLa. The pitch of sub word line drivers SWDa–SWDd corresponds to that of sub word lines SWLa–SWLd. Main word line MWLb is also provided corresponding to four sub word lines. In region SDB# where main word lines MWLa and MWLb are connected to sub word line drivers, the pitch of main word lines MWLa–MWLb is required to correspond to the pitch of four sub word line drivers SWD (SWDa–SWDd). Accordingly, in the sub word line driver arranging region (sub word line driver band) SDB#, main word lines MWLa–MWLb linearly extend in the row direction similarly to interconnection line 10a shown in FIG. 3, and the pitch thereof is set to the same value for all main word lines.

No memory cell is connected to main word lines MWLa and MWLb on the memory array, and there arises no problem even if the pitch of main word lines is different from that of sub word lines SWLa–SWLd. Since memory cells are connected to respective sub word lines SWLa–SWLd, sub word lines SWLa–SWLd are arranged to linearly extend in the row direction corresponding to memory cell rows. Even if main word line MWLa crosses sub word lines SWLa and SWLb in the two dimensional layout and is placed between sub word lines SWLb and SWLc in the two dimensional layout as shown in FIG. 4, a memory cell selection operation is not influenced. The shift-aside structure of the main word lines of shifting the main word lines in the width direction thus allows empty region 15 to be generated without adversely affecting the memory cell select operation and the memory cell arrangement.

Figure 5:
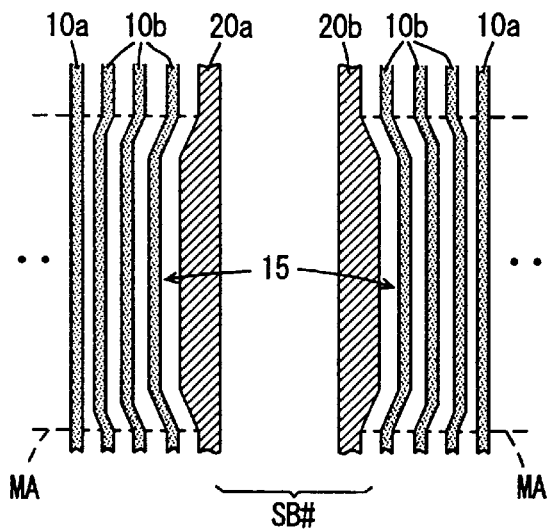
FIG. 5 schematically shows a layout of interconnection lines in a sense amplifier band in an array portion shown in FIG. 3.

Referring to FIG. 5, empty region 15 is utilized to expand conductive interconnection lines 20a and 20b extending in the row direction in sense amplifier band SB# onto a region where memory cells are formed in memory array MA. Accordingly, conductive interconnection lines 20a and 20b have the width increased in empty region 15 and the resistance reduced, so that interconnection lines 20a and 20b can transmit signal/voltage stably at a high speed. The interconnection line located in sense amplifier band SB# and partially expanded onto the region where memory cells are formed may be interconnection lines formed at the same layer as that of conductive interconnection lines 10a and 10b forming main word lines. Conductive interconnection lines arranged nearest to the memory array in the planar layout and formed at the same interconnection layer as that of the main word lines are extended onto the memory array in empty region 15 to increase the width of the conductive interconnection lines.

As discussed above, according to the first embodiment of the invention, main word lines are shifted in the width direction to generate an empty region on the memory cell array. Accordingly, the width of a necessary interconnection line is increased without increasing the area of the sense amplifier band in the column direction to reduce the interconnection resistance and implement a semiconductor memory device operating stably at a high speed.

Second Embodiment

Figure 6:
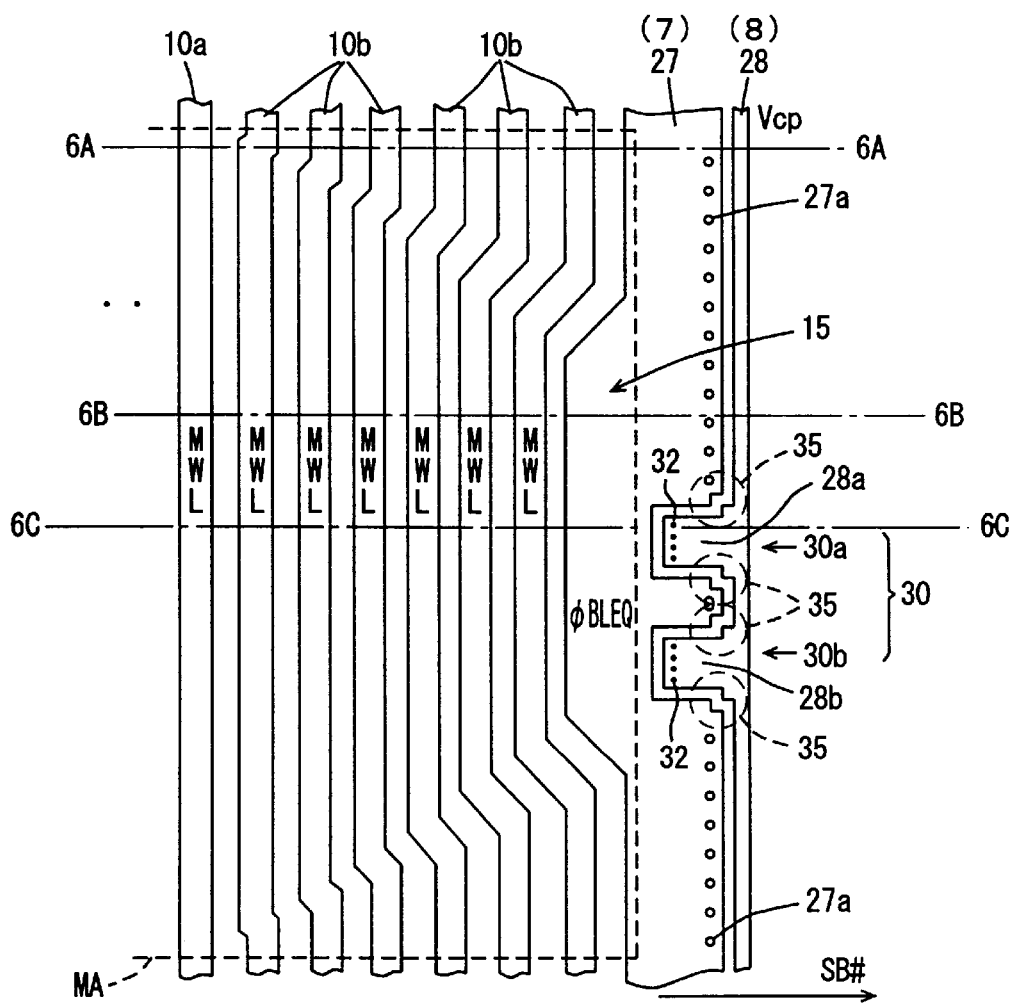
FIG. 6 schematically shows a structure of a main portion of a semiconductor memory device according to the second embodiment of the invention.

FIG. 6 schematically shows a structure of a main portion of a semiconductor memory device according to the second embodiment of the present invention. FIG. 6 schematically shows a structure of a portion corresponding to one memory array MA. Referring to FIG. 6, a conductive interconnection line 27 transmitting bit line equalize instruction signal φBLEQ is placed in sense amplifier band SB# in the row direction. Conductive interconnection line 27 corresponds to signal line 7 shown in FIG. 2.

The width of conductive interconnection line 27 relative to the column direction is increased in empty region 15 generated by shifting in the width direction conductive interconnection line 10b constituting main word line MWL. Conductive interconnection line 27 transmitting bit line equalize instruction signal φBLEQ includes a portion formed on memory array MA. A bit line equalize/precharge circuit provided corresponding to each bit line pair includes three MOS transistors. Therefore, more gate capacitances are connected to conductive interconnection line 27 to increase the parasitic capacitance compared with another signal interconnection line (e.g. an interconnection line for a bit line isolation instruct signal). However, the resistance of conductive interconnection line 27 constituting signal line 7 transmitting bit line equalize instruction signal φBLEQ can be decreased by increasing the width of conductive interconnection line 27 relative to the column direction in empty region 15. Accordingly, RC delay of signals can be reduced and bit line equalize instruction signal φBLEQ can be transmitted at a high speed.

A conductive interconnection line 28 forming a cell plate line 8 which transmits cell plate voltage Vcp is arranged adjacent to conductive interconnection line 27 which in turn transmits bit line equalize instruction signal φBLEQ. Conductive interconnection line 28 constituting cell plate line 8 includes protruding portions 28a and 28b formed to interdigitate with recessed regions 30a and 30b respectively formed at conductive interconnection line 27. In protruding portions 28a and 28b, a contact hole 32 is formed at a position closest to memory cell array MA. Contact hole 32 is provided for making an electrical contact with a cell plate node of a memory cell capacitor (discussed later). Cell plate voltage Vcp is constantly supplied to the cell plate node of the memory cell capacitor and it is enough to maintain the cell plate node at a constant voltage. Therefore, a large amount of current does not flow through cell plate line 8 (conductive interconnection line 28). Conductive interconnection line 28 transmitting cell plate voltage Vcp accordingly has a width relatively reduced. Contact hole 32 for making an electrical contact with the cell plate node of the memory cell capacitor included in memory cell array MA is formed at protruding portions 28a and 28b. The distance between the storage node of a memory cell and cell plate contact 32 can be set to a length advantageous for the process. The distance between storage node SN and cell plate contact hole 32 is described below.

Figure 7:
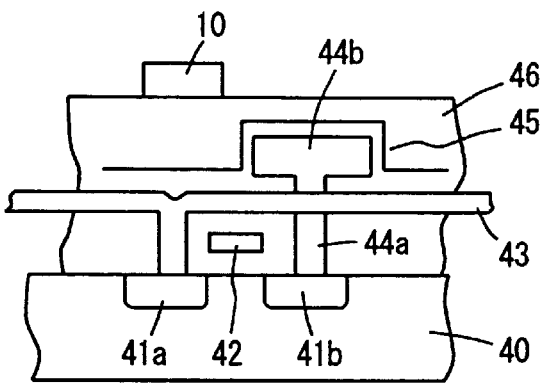
FIG. 7 schematically shows a cross sectional structure of a memory cell employed in the second embodiment of the invention.

FIG. 7 schematically shows one example of a memory cell structure. Referring to FIG. 7, a memory cell includes high concentration impurity regions 41a and 41b formed to be spaced from each other at a surface of a semiconductor substrate region 40, and a gate electrode layer 42 formed above a channel region between impurity regions 41a and 41b with a gate insulating film (not shown) underlaid. Impurity region 41a is connected to a conductive interconnection line 43 formed of polycide, for example, and constituting a bit line. Impurity region 41b is connected to a conductive layer 44a. An upper portion of conductive layer 44a extends above conductive interconnection line 43, and a top portion of conductive layer 44a is formed into a flat region 44b for increasing a capacitor area. Conductive layers 44a and 44b constitute a storage node electrode layer. A cell plate electrode layer is formed facing to flat portion 44b of the storage node electrode layer.

Gate electrode layer 42 is formed of a first level polysilicon layer and connected to a sub word line SWL. Storage node electrode layers 44a and 44b are formed of a third level polysilicon layer, and flat portion 44b is formed at a layer higher than that of conductive interconnection line 43 constituting a bit line. Cell plate electrode layer 45 is formed of a fourth level polysilicon interconnection layer, for example, to extend over the memory array.

A conductive interconnection line 10 constituting a main word line formed of a first level aluminum interconnection layer is formed on cell plate electrode layer 45 with interlayer insulating film 46 therebetween.

As shown in FIG. 7, the memory cell capacitor is formed to extend onto the surface of semiconductor substrate region 40 and has a so-called stacked capacitor structure. The memory cell has a three dimensional structure. Cell plate electrode layer 45 is electrically connected to conductive interconnection line 28 shown in FIG. 6 through contact hole 32. In the boundary region of the sense amplifier band, only a bit line isolation gate formed of the first level polysilicon interconnection line is formed. As a result, the storage node electrode layer generates a step portion.

Figure 8:
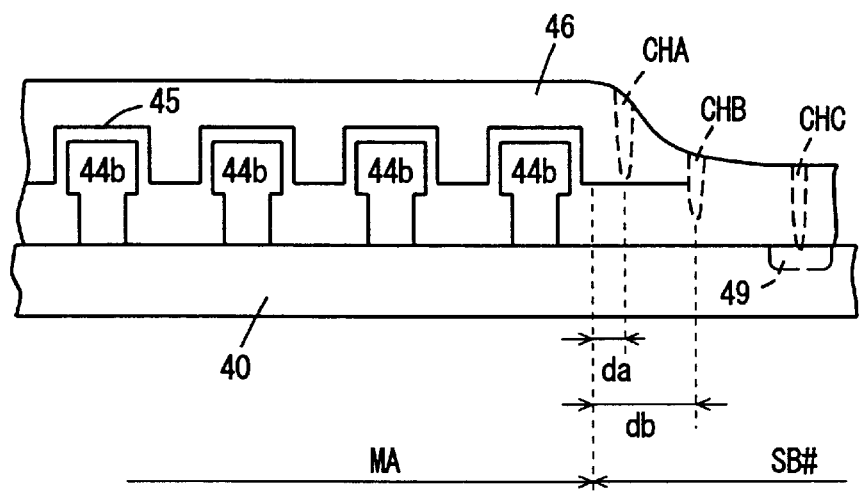
FIG. 8 depicts an effect of a position of a cell plate contact shown in FIG. 6.

FIG. 8 schematically shows a structure in the vicinity of a boundary region between memory array MA and sense amplifier band SB#. FIG. 8 illustrates flat portion 44b at an upper layer of the storage node electrode layer and cell plate electrode layer 45 placed facing to flat portion 44b. Interlayer insulating film 46 is formed on cell plate electrode layer 45 for making an electrical contact between cell plate electrode layer 45 and cell plate line 8 (conductive interconnection line 28) shown in FIG. 6. After formation of interlayer insulating film 46, a contact hole for making contact between the first level aluminum interconnection layer and cell plate electrode layer 45 is formed. Simultaneously, a contact hole for making an electrical contact between the first level aluminum interconnection layer and an active region (impurity region) 49 formed at the surface of semiconductor substrate region 40 is formed.

Interlayer insulating film 46 has a step generated in the boundary region between memory array MA and sense amplifier band SB# since storage node electrode layer 44b is formed. In the region of sense amplifier band SB#, only a bit line isolation transistor is arranged. Concerning the thickness of interlayer insulating film 46, the thickness of the portion deposited on cell plate electrode layer 45 is approximately equal to the thickness of the interlayer insulating film formed on active region 49. When a contact hole CHA is formed in a region located with a distance, da, from the boundary of memory array MA, the depth of contact hole CHA is approximately equal to the depth of a contact hole CHC formed in a flat region of interlayer insulating film 46 in sense amplifier band SB#. However, if a contact hole is formed at a position with a distance, db, from memory array MA, the contact hole CHB penetrates cell plate electrode layer 45 since the thickness of interlayer insulating film 46 is small at that position. If a bit line is arranged at a lower layer, the bit line and the first level aluminum interconnection layer (conductive interconnection line) formed at an upper layer are short-circuited.

For this reason, contact hole 32 for cell plate electrode layer 45 is formed at a position as close as possible to memory array MA as shown in FIG. 6. In this case, cell plate electrode layer 45 extends in a certain range, and there is a certain allowance for distance, da, shown in FIG. 8. It is enough to form contact hole CHA at a position which allows the depth of contact hole CHA to be approximately the same as the depth of contact hole CHC for active region 49. Accordingly, contact hole 32 shown in FIG. 6 can be formed at a position advantageous to the manufacturing process, such as a position which allows processing to be performed easily and a contact hole to be formed in the same process as that of other contact holes. Further, the degree of freedom of location where cell plate contact 32 is arranged is improved to implement an easier layout. Distance, da, fiom storage node electrode 44b to cell plate contact 32 can be set to a suitable value in a region adjacent to the empty region. Accordingly, in a region adjacent to empty region 15 (referred to as shift-aside region), recessed regions 30a and 30b are provided to conductive interconnection line 27 transmitting bit line equalize instruction signal φBLEQ, and protruding portions 28a and 28b interdigitating with regions 30a and 30b are formed for conductive interconnection line 28 transmitting cell plate voltage Vcp. As a result, contact hole CHC for active region 49 in sense amplifier band SB# and cell plate contact hole 32 (CHA) can be formed simultaneously and the number of manufacturing processes does not increase. If the cell plate contact should be formed at contact hole CHB shown in FIG. 8, the contact hole for making a contact to a cell plate and contact hole CHC located at another location in sense amplifier band SB# should be formed in separate processes.

Referring again to FIG. 6, the width of conductive interconnection line 27 transmitting bit line equalize signal φBLEQ is slightly reduced by recessed region 30. However, the width at recessed regions 30a and 30b is equal to or greater than the original line width, for example, the line width in the sub word Line driver region. Therefore, there is no increase in the resistance of conductive interconnection line 27 due to provision of recessed regions 30a and 30b. Two recessed regions 30a and 30b are provided only in the region necessary for making the cell plate contact. The width of conductive interconnection line 27 is large in the region between recessed regions 30a and 30b to prevent an advantageous effect obtained by expanding the line width fiom being damaged. Two protruding portions 28a and 28b are provided to conductive interconnection line 28 transmitting cell plate voltage Vcp in order to stably transmit cell plate voltage Vcp with a low resistance to a cell plate electrode layer by a number of contact holes 32 without increase in a contact resistance.

Referring to the arrangement shown in FIG. 6, conductive interconnection line 27 extends toward sense amplifier band SB# between two recessed regions 30a and 30b in order to increase the distance between contact hole 32 for a cell plate node and contact hole 27a for making contact between a bit line equalizing transistor for and conductive interconnection line 27 to increase a margin of a contact hole in layout, and to surely prevent contact between a cell plate layer at a lower layer and a contact hole 27a. Contact hole 27a may be provided to each bit line pair, or to a prescribed number of bit line pairs.

Referring to FIG. 6, the line width at of protruded portions 28a and 28b of conductive interconnection line 28 transmitting cell plate voltage Vcp is increased stepwise at a portion 35. Portion 35 in protruded portions 28a and 28b is utilized to prevent the line width from being decreased by the halation in photolithography. The problem of the halation is discussed below.

Figure 9:
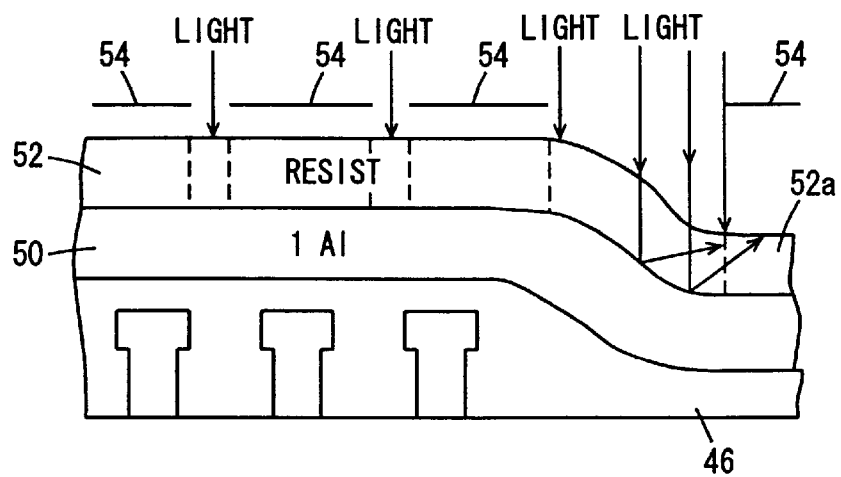
FIG. 9 depicts an effect of a shape of the cell plate line shown in FIG. 6.

FIG. 9 schematically shows a cross sectional structure of the semiconductor memory device in a manufacturing step of the second embodiment of the invention. Referring to FIG. 9, a first level aluminum interconnection layer (1Al) 50 is formed on interlayer insulating film 46. A resist 52 is applied on the first level aluminum interconnection layer 50. The resist is irradiated with light via a mask 54 having a prescribed pattern shape. Resist 52 is a positive resist having a portion exposed to light dissolved in a developer. As shown in FIG. 6, at the edge portions of protruding portions 28a and 28b relative to the row direction, conductive interconnection lines 27 and 28 facing to each other are arranged extending in the column direction. Therefore, in the region of the step, mask 54 has a wide gap and the light is incident on the step portion via the mask 54. With light perpendicularly incident on the flat portion, irregular reflection is caused. However, the light applied via mask 54 causes the irregular reflection at the step portion, causing a portion 52a of resist 52 corresponding to conductive interconnection line 28 which transmits cell plate voltage Vcp to be excessively exposed by reflected light. As a result, after development, the width of region 52a of resist 52 in the column direction decreases to a width less than the width defined by mask 54. The first level aluminum interconnection layer 50 is patterned by etching with the resist after development used as a mask.

Figure 10:
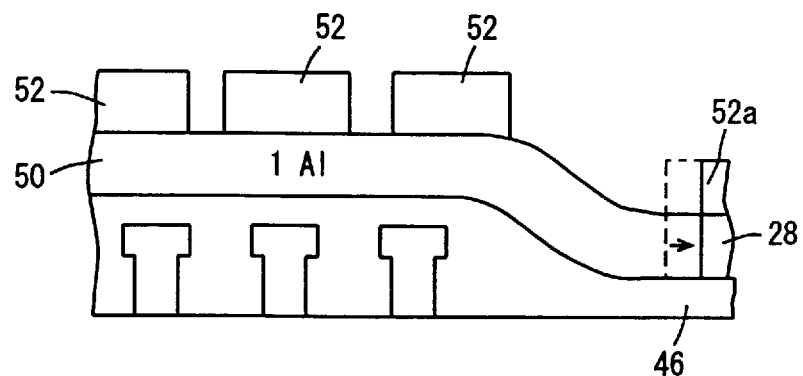
FIG. 10 depicts a functional effect of the shape of the cell plate line shown in FIG. 6.

Referring to FIG. 10, if region 52a of resist 52 on conductive interconnection line 28 transmitting cell plate voltage Vcp is excessively removed to be narrower than the actual mask pattern as shown by the dashed line, the width of conductive interconnection line 28 decreases. In the other flat region, resist 52 is patterned according to the mask pattern so that the first level aluminum interconnection layer 50 is correctly patterned. In view of this, the line width in portions 35 of protruding regions 28a and 28b is increased stepwise in order to prevent reduction of the line width due to an abnormal exposure in the patterning. Accordingly, even if the abnormal exposure occurs due to the halation in the exposure, to cause decrease of the line width, open-circuit or increase in resistance resulting from decrease of the line width at this portion can be prevented since the line width is preliminarily increased.

Conductive interconnection line 27 transmitting bit line equalize instruction signal φBLEQ is arranged adjacently to a portion of conductive interconnection line 28 having a narrow line width. The region where exposure light passes is sufficiently small, the region where conductive interconnection line 28 is arranged is approximately flat, so that no abnormal patterning due to the halation of the exposure light occurs to allow patterning to be performed according to the mask pattern.

Figure 11A:
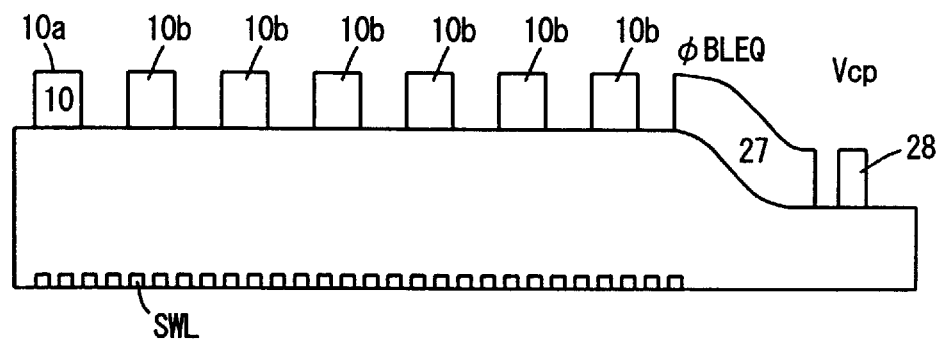
FIG. 11A shows a cross sectional structure along line 6A—6A of FIG. 6.

FIG. 11A schematically shows a cross sectional structure along line 6A—6A in FIG. 6. Referring to FIG. 11A, four sub word lines SWLs are provided to each of conductive interconnection lines 10a and 10b forming main word lines MWL. Sub word lines SWLs are arranged at the same intervals. Conductive interconnection line 27 transmitting bit line equalize instruction signal φBLEQ is arranged in the regions of the memory array and the sense amplifier band to cover the step portion. Conductive interconnection line 28 transmitting cell plate voltage Vcp is formed at the flat portion in the region of the sense amplifier band. In the region shown in FIG. 11A, conductive interconnection lines 10a and 10b are arranged with approximately the same width and the same space.

Figure 11B:
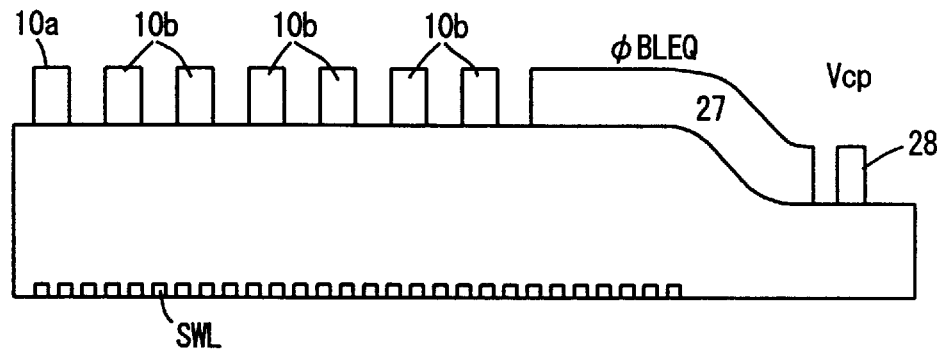
FIG. 11B shows a cross sectional structure along line 6B—6B in FIG. 6.

FIG. 11B schematically shows a cross sectional structure along ling 6B—6B in FIG. 6. Referring to FIG. 11B, conductive interconnection lines 10a and 10b on the memory array are shifted in the width direction, and the widths and the spaces of conductive interconnection lines 10a and 10b are decreased. However, the widths and the spaces of sub word lines SWLs are not changed. In the region shown in FIG. 11B, conductive interconnection line 27 transmitting bit line equalize instruction signal φBLEQ is expanded onto the memory array. Conductive interconnection line 28 transmitting cell plate voltage Vcp is arranged at the flat portion in the region of the sense amplifier band.

Figure 11C:
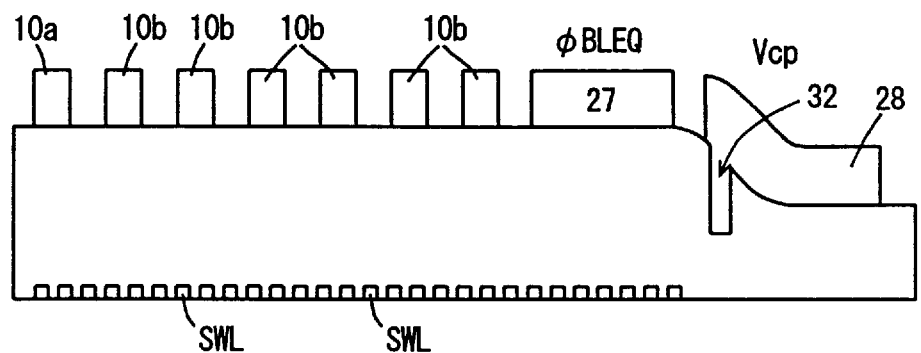
FIG. 11C schematically shows a cross sectional structure along line 6C—6C in FIG. 6.

FIG. 11C schematically shows a cross sectional structure along line 6C—6C in FIG. 6. FIG. 11C also illustrates an arrangement where conductive interconnection lines 10a and 10b have the shift-aside structure having the width and space decreased. Conductive interconnection line 27 transmitting bit line equalize instruction signal φBLEQ having recessed region 30a is arranged to overlap with the memory array and sub word lines SWLs in plan view. Conductive interconnection line 28 transmitting cell plate voltage Vcp is expanded onto the step portion. Contact hole 32 for providing a cell plate contact is formed at an appropriate position of the step portion. In this region, conductive interconnection line 28 is electrically connected to a cell plate electrode layer (not shown). Contact hole 32 is arranged at a position which is sufficiently close to the region where the memory array is formed. Accordingly, contact hole 32 is prevented from penetrating through the cell plate electrode layer.

In the arrangement illustrated in FIG. 6, the contact of conductive interconnection line 27 with a bit line equalize/precharge transistor is made at a region between memory array MA and sense amplifier band SB# via contact hole 27a. However, another structure as the word line shunt structure is possible wherein the interconnection line transmitting signal φBLEQ has a double-layer structure and contact of conductive interconnection line 27 with a signal line at a lower layer (transistor gate) is made at a crossing of the sense amplifier band and the word line sub decoder band and no contact hole 27a is provided at the region between the memory array MA and sense amplifier band SB# shown in FIG. 6. In this structure, protruding regions 28a and 28b may be coupled to form one protruding region. Alternatively, cell plate conductive interconnection line 28 may be arranged to extend with a constant width and protruding regions 28a and 28b may be not be provided.

As described above, according to the second embodiment of the invention, the conductive interconnection line transmitting the bit line equalize instruction signal is fabricated to expand onto the memory array in the region where the main word lines are shifted in the width direction, enabling the bit line equalize instruction signal to be transmitted at a high speed. Further, the conductive interconnection line transmitting the cell plate voltage is arranged adjacently to the conductive interconnection line transmitting the bit line equalize instruction signal, so that the line width can be increased in a required region (cell plate contact region) to make contact with the cell plate electrode node. In the cell plate contact region, the conductive interconnection line transmitting the bit line equalize instruction signal is arranged on the memory array and the cell plate contact region is arranged to be sufficiently close to the memory array. Accordingly, the contact hole for the cell plate contact can be reliably formed in the same process step as that of the contacts for other interconnection lines and the cell plate contact can be formed without increasing the number of manufacturing process steps.

In addition, the conductive interconnection line transmitting the cell plate voltage has its width increased stepwise in the region where the conductive interconnection line is expanded. Therefore, in patterning, even if an abnormal exposure arises due to the halation of the exposure light, a required minimum line width can be secured to prevent increase in the resistance and open-circuit, achieving a stable transmission of cell plate voltage Vcp.

Third Embodiment

Figure 12:
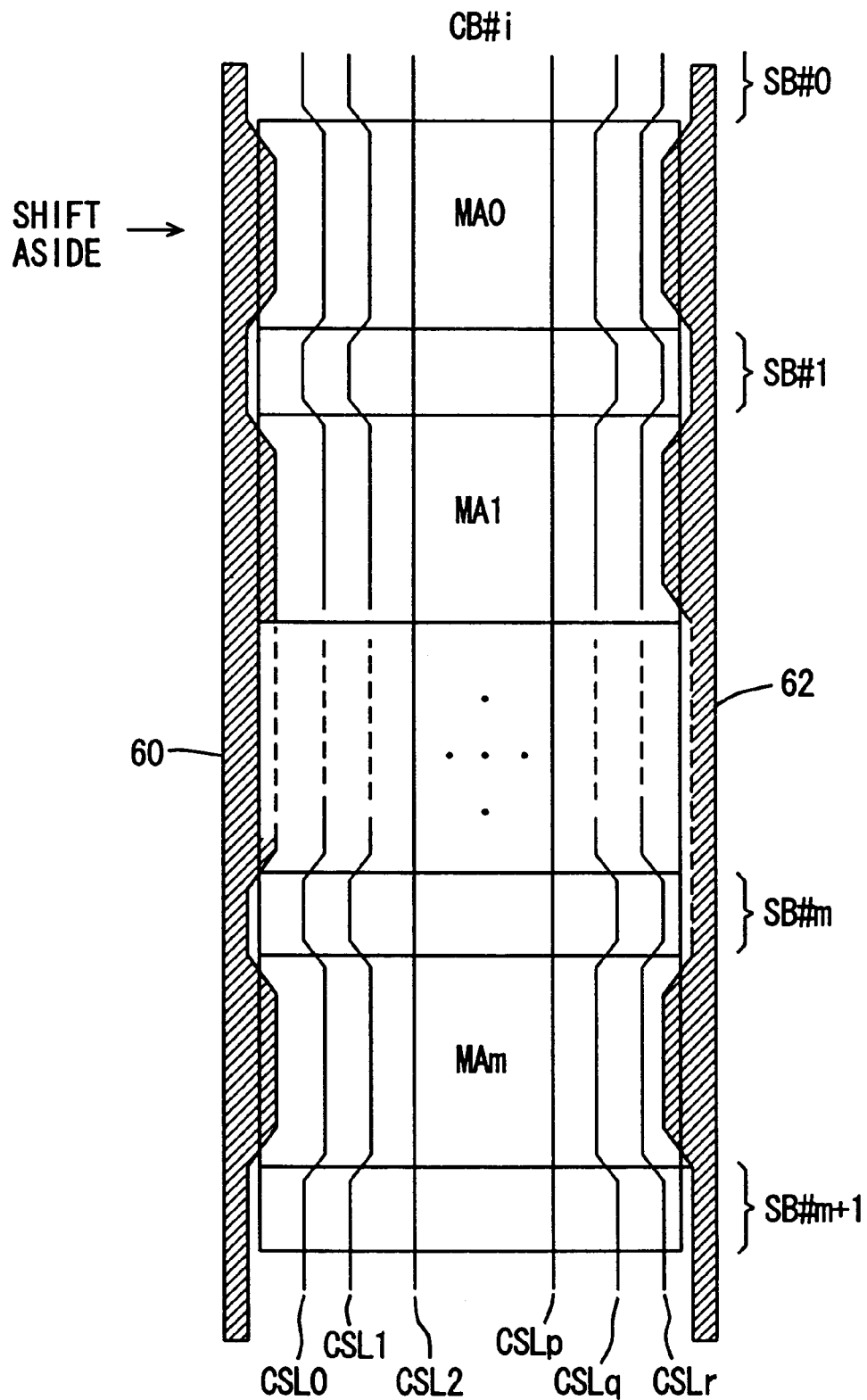
FIG. 12 schematically shows a structure of an array portion of a semiconductor memory device according to the third embodiment of the invention.

FIG. 12 schematically shows a structure of a main portion of a semiconductor memory device according to the third embodiment of the present invention. FIG. 12 shows a structure of a portion related to one column block CB#i. Referring to FIG. 12, column block CB#i includes memory arrays MA0–MAm arranged alignedly in the column direction. Sense amplifier bands SB#1–SB#m are arranged between memory arrays adjacent to each other, and sense amplifier bands SB#0 and SB#m+1 are arranged on the outside of memory arrays MA0 and MAm respectively.

Column selection lines CSL0–CSLr are commonly provided to memory arrays MA0–MAm in column block CB#i. Column selection lines CSL0–CSLr are shifted in the width direction on the region of memory arrays MA0–MAm. FIG. 12 illustrates as one example a structure in which column selection lines CSL0 and CSL1 as well as column selection lines CSLq and CSLr are partially shifted to the central portion of the memory arrays (the central portion relative to the row direction) on memory arrays MA0–MAm. IO gates are provided to respective sense amplifier bands SB#0–SB#m+1, and column selection lines CSL0–CSLr are arranged to have the same pitch as the output pitch of a column decoder (not shown) in sense amplifier bands SB#0–SB#m+1.

On the outside of column block CB#i relative to the row direction, power source voltage lines 60 and 62 that transmit power source voltage Vcc or Vss are arranged. Power source voltage lines 60 and 62 have a portion having the width increased in an empty region generated by shifting the column selection lines in the width direction in the regions on memory arrays MA0–MAm. Accordingly, power source voltage lines 60 and 62 have portions that are extended onto memory arrays MA0–MAm. Power source voltage lines 60 and 62 are connected in sense amplifier bands SB#0–SB#m+1 respectively to sense power source lines transmitting sense amplifier power source voltage.

Figure 13:
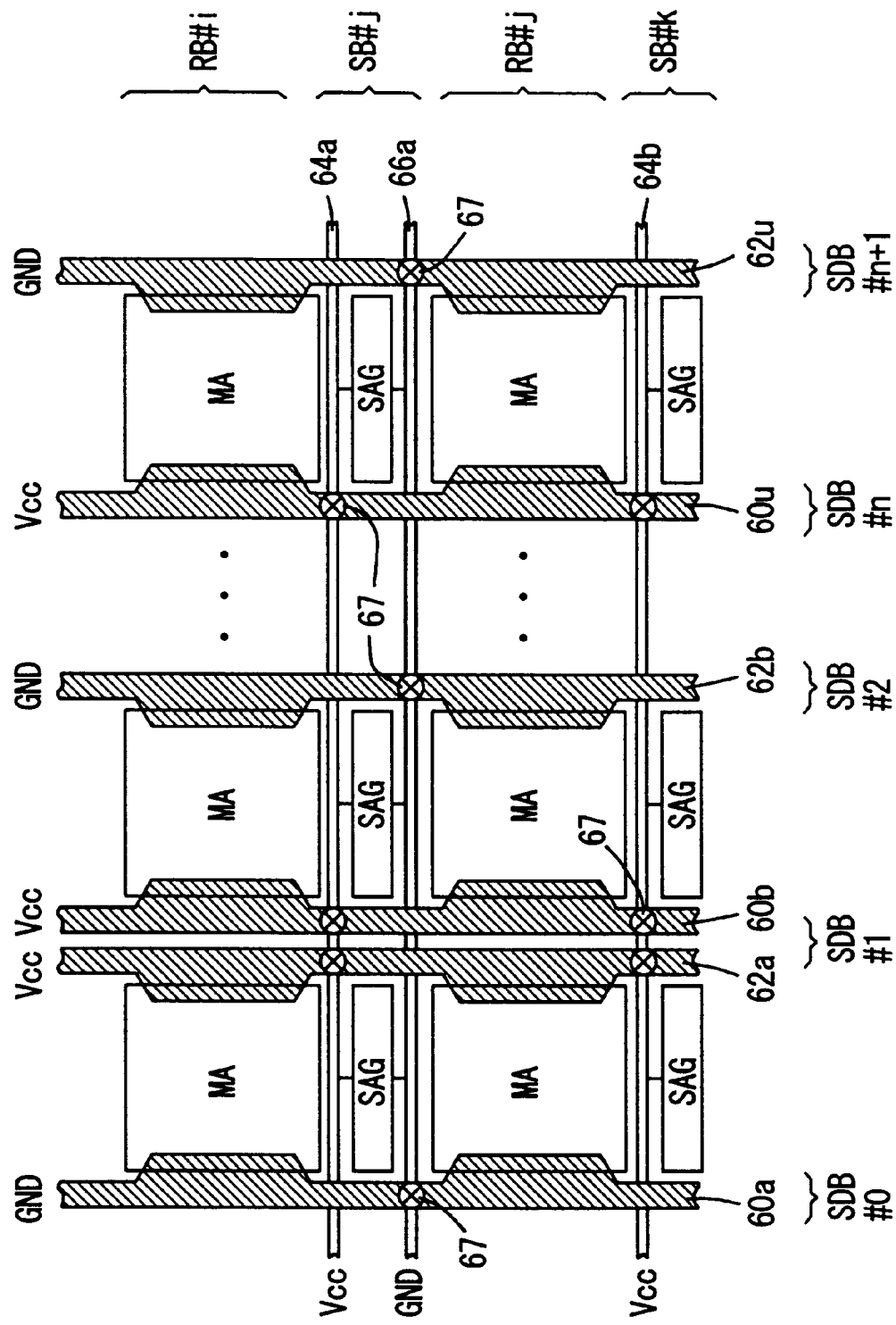
FIG. 13 specifically shows a layout of a power supply line of the memory array portion according to the third embodiment of the invention.

FIG. 13 shows one example of an arrangement of the sense power supply lines. FIG. 13 schematically shows a structure for two row blocks RB#i and RB#j. Sense amplifier band SB#j is placed between row blocks RB#i and RB#j, and a sense amplifier group SAG is arranged in sense amplifier band SB#j corresponding to memory arrays MAs. A sense power supply line 64a transmitting power supply voltage Vcc commonly to sense amplifier groups SAGs in the row direction, and a sense ground line 66a extending in the row direction to transmit ground voltage GND to sense amplifier groups SAGs are arranged in sense amplifier band SB#j. In sense amplifier band SB#k provided between row block RB#j and a row block (not shown), a sense power supply line 64b transmitting power supply voltage Vcc commonly to sense amplifier groups SAGs is arranged extending in the row direction.

In the column direction, power source voltage lines 60a–60u and power source voltage lines 62a–62u extending in the column direction are arranged in sub word line driver arranging regions SDB#0–SDB#n+1 respectively. In the sub word line driver arranging region SDB#0, power source voltage line 60a transmitting ground voltage GND is arranged, and power source voltage line 60a and sense ground line 66a are electrically connected to each other via a contact hole 67 in sense amplifier band SB#j. In the sub word line driver arranging region SDB#1, power source voltage lines 62a and 60b transmitting power supply voltage Vcc are arranged in parallel to each other. Power source voltage lines 62a and 60b are electrically connected to sense power supply lines 64a and 64b respectively via contact holes 67 in sense amplifier bands SB#j and SB#k.

Power source voltage line 62b transmitting ground voltage GND is placed in sub word line driver arranging region SB#2. Power source voltage line 62b is electrically connected to sense ground line 66a via contact hole 67 in sense amplifier band SB#j. Power source voltage line 60u transmitting power supply voltage Vcc is arranged in sub word line driver arranging region SB#n. Power source voltage line 60u is electrically connected to sense power supply lines 64a and 64b via contact holes 67 in sense amplifier bands SB#j and SB#k respectively. Power source voltage line 62u transmitting ground voltage GND is placed in sub word line driver arranging region SDB#n+1. Power source voltage line 62u is electrically connected to sense ground line 66a via contact hole 67 in sense amplifier band SB#j.

Power source voltage lines 60a–60u and 62a–62u each have their portions extended onto the region of memory arrays MAs, and the width of the extended portions is thus increased. Even if the line width of sense power supply lines 64a and 64b and sense ground line 66a provided to sense amplifier groups SAGs in parallel to each other is relatively small, those lines are electrically connected to power source voltage lines 60a–60u and 62a–62u to equivalently reduce the resistance of sense power supply lines 64a and 64b and sense ground line 66a, so that operation power source voltages, Vcc and GND for the sense amplifiers can be transmitted stably to sense amplifier groups SAGs. In particular, sense power supply lines 64a and 64b and sense ground line 66a are supplied with ground voltage GND and power supply voltage Vcc every two memory arrays, and voltage variation due to interconnection resistance of sense power supply lines 64a and 64b and sense ground line 66a can be restricted. Consequently, the voltage at the same level can be transmitted to each sense amplifier and variation in the sense power source voltage due to the sense current is small to achieve a stable sense operation.

According to the arrangement shown in FIG. 13, power source voltage line 60 (60a–60u) transmitting ground voltage GND is placed on one side of one memory array MA, and power source voltage line 62 (62a–62u) transmitting power supply voltage Vcc is arranged on the other side of memory array MA. However, both of power source voltage lines transmitting ground voltage GND and power supply voltage Vcc may be arranged in one sub word line driver arranging region SDB#.

In the case of the structure shown in FIG. 13, sense power supply line 64a and sense ground line 66a may be isolated with an appropriate number of memory arrays being a unit. In other words, the sense power source lines may be provided one for a prescribed number of sense amplifier groups SAGs. When this arrangement is employed, the stable sensing operation is also possible since power source voltage lines arranged to extend in the column direction stably supply power supply voltage Vcc and ground voltage GND.

Power source voltage lines 60a–60u and 62a–62u are formed at a second level interconnection layer higher than the main word lines at the interconnection layer of memory array MA being at a first level aluminum interconnection layer, and therefore can be arranged extending on a memory mat without adversely affecting the layout of main word lines MWLs.

Power source voltage lines 60a–60u and 62a–62u are connected to power supply voltage lines and ground voltage lines arranged to surround a memory mat to form a so-called "meshed-shape power source arrangement." The present invention is not characterized in that the power source voltage lines are arranged extending on the memory mat in "meshed-shape", but characterized in that the column selection lines are shifted in the width direction to generate an empty region on the memory array and allow the power source voltage lines to expand into the empty region, in order to reduce the resistance of power source voltage lines arranged extending on the memory mat.

According to the structure illustrated in FIGS. 12 and 13, the column selection lines are shifted in the width direction to the central region relative to the row direction of memory array MA, and the power source lines are expanded onto the memory array. However, the column selection lines may be shifted in the width direction toward the region where the sub word line drivers are arranged, power supply voltage lines may be so arranged on memory array MA as to increase the width of the power supply voltage lines in the region on the memory array MA as shown in FIG. 14.

Figure 14:
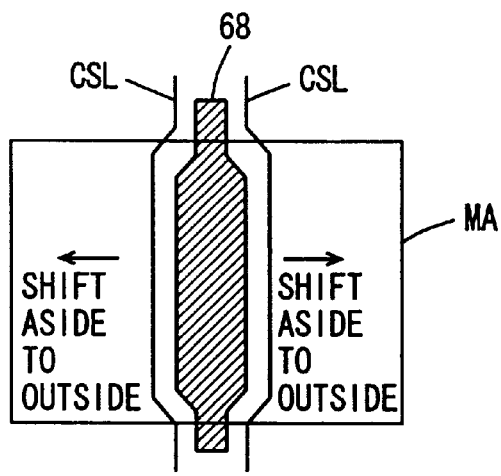
FIG. 14 schematically shows a structure of a modification of the third embodiment of the invention.

Referring to FIG. 14, a power source voltage line 68 is arranged between column selection lines CSLs. Usually one column selection line CSL is provided to a plurality of bit line pairs, and therefore power source voltage line 68 can be arranged between column selection lines CSLs with a sufficient margin. The power source voltage line 68 may be any of power supply voltage line and ground line.

According to the third embodiment of the present invention, column selection lines are shifted in the width direction to generate an empty region on the memory array, and the width of power source lines are increased in the empty region. As a result, the power source lines can be reduced in the resistance to stably transmit the power source voltage to the sense amplifiers.

Fourth Embodiment

Figure 15:
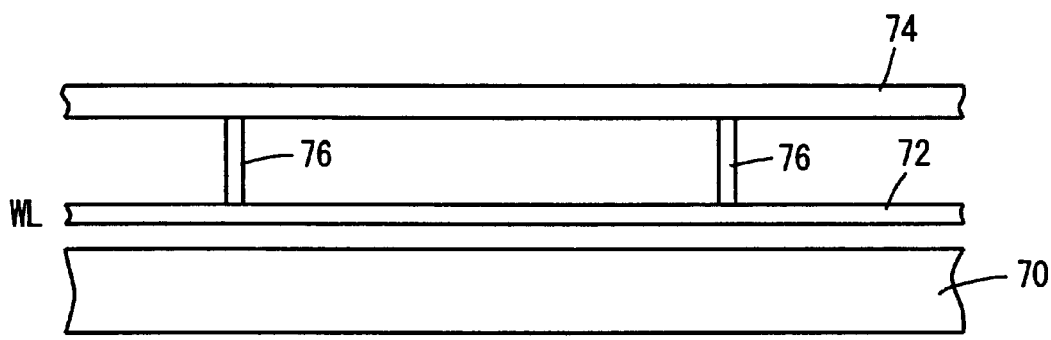
FIG. 15 schematically shows a word line structure of a semiconductor memory device according to the fourth embodiment of the invention.

FIG. 15 schematically shows a structure of a main portion of a semiconductor memory device according to the fourth embodiment of the present invention. Referring to FIG. 15, a gate electrode layer 72 formed of a first level polysilicon layer is arranged on a semiconductor substrate region 70. Gate electrode layer 72 is used as a word line WL, and access transistors of memory cells arranged alignedly in the row direction are connected to gate electrode layer 72. A low-resistance conductive layer 74 formed of the first level aluminum interconnection layer having a low resistance is formed above gate electrode layer 72 in parallel with gate electrode layer 72. Low-resistance conductive layer 74 and gate electrode layer 72 are electrically connected by low-resistance conductive material 76 at prescribed intervals. Accordingly, the resistance of gate electrode layer 72 is equivalently decreased. The region where conductive layer 74 and gate electrode layer 72 are electrically connected is generally referred to as a word line shunt region. No memory cell is arranged in the word line shunt region.

Figure 16:
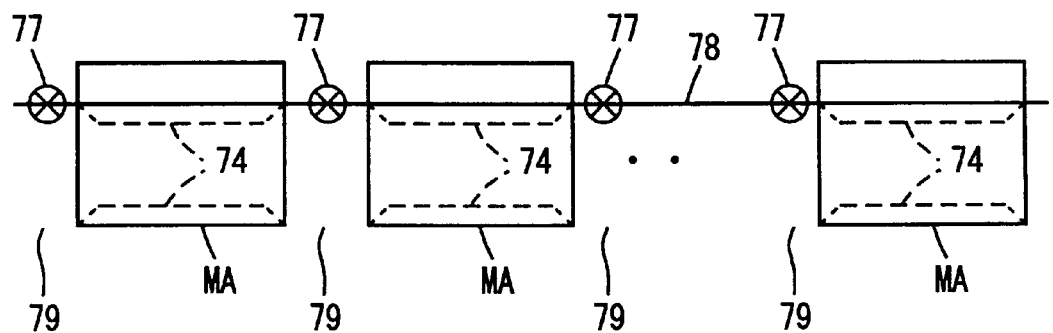
FIG. 16 is a schematic plan view of a layout of the word line structure according to the fourth embodiment of the invention.
Figure 17:
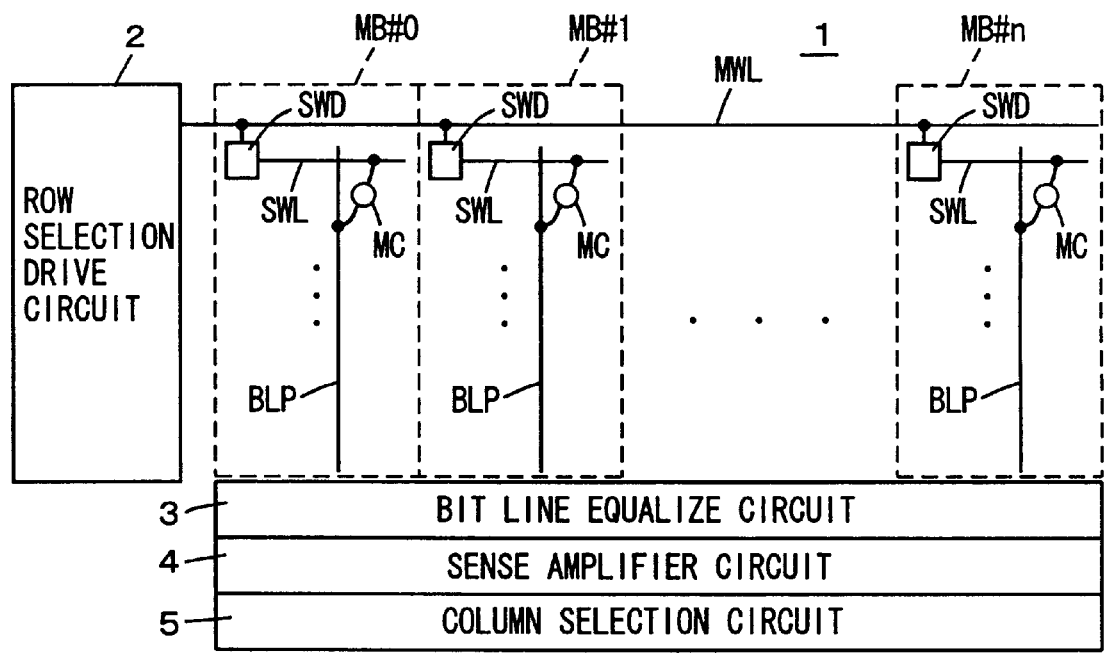
FIG. 17 schematically shows an entire structure of a conventional semiconductor memory device.
Figure 18:
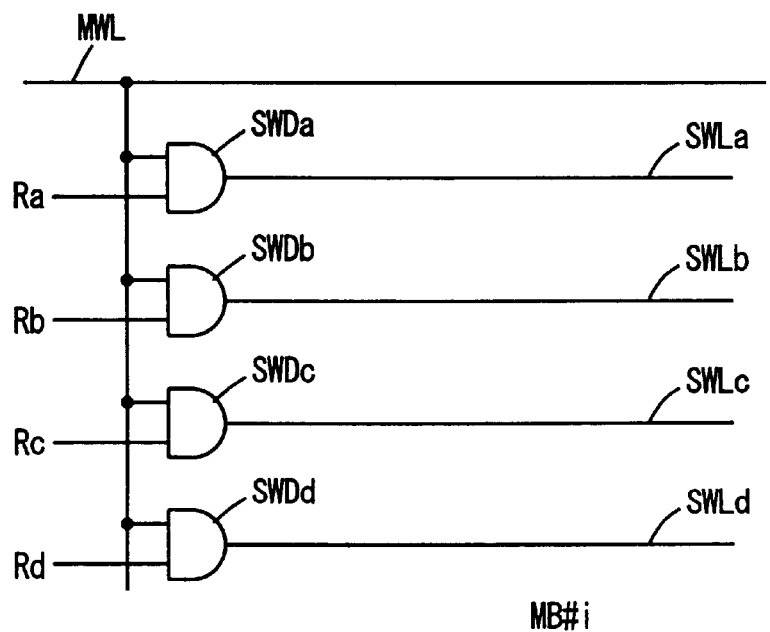
FIG. 18 schematically shows one example of a structure of sub word line drivers in the semiconductor memory device shown in FIG. 17.
Figure 19A:
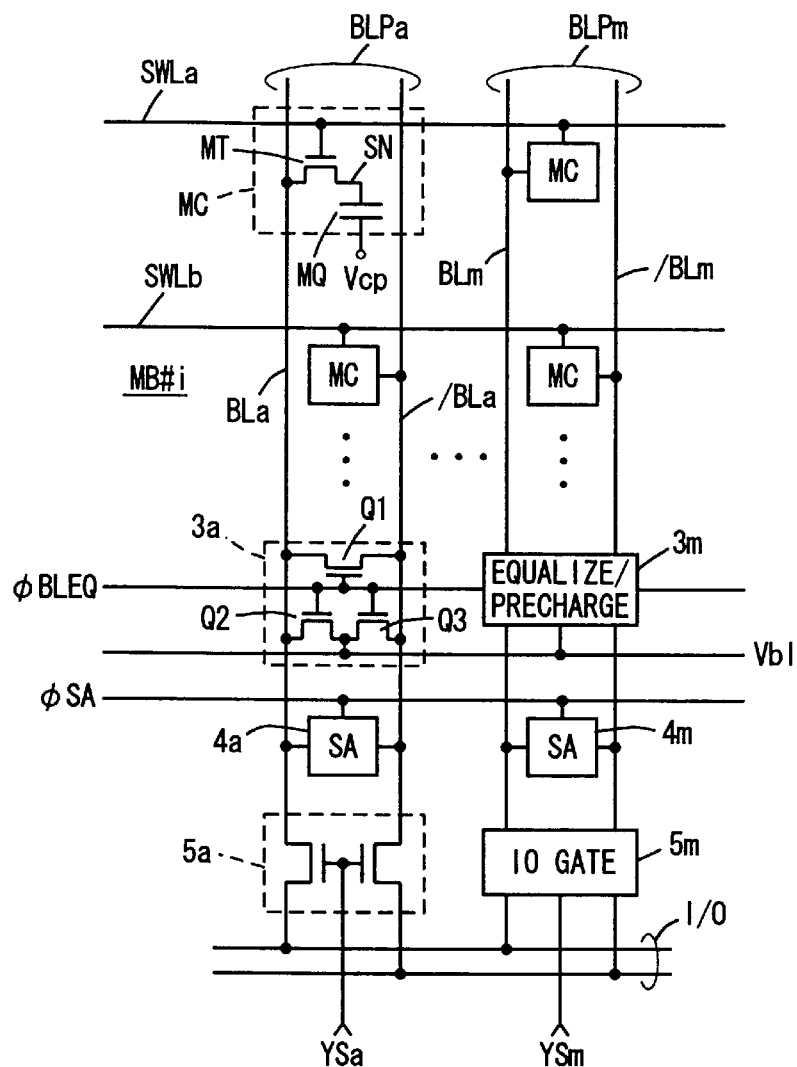
FIG. 19A specifically shows a structure of an array portion of the semiconductor memory device of FIG. 17.
Figure 19B:
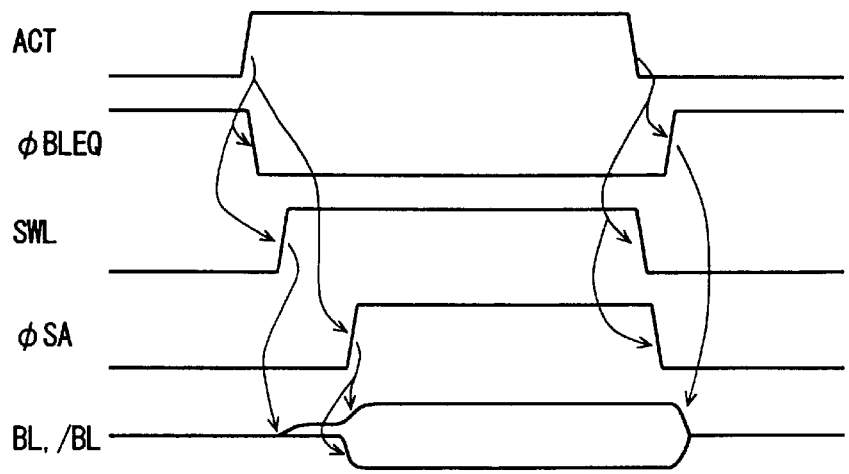
FIG. 19B shows signal waveforms representing an operation of the structure shown in FIG. 19A.

FIG. 16 schematically shows a structure of a memory mat having the word line shunt region. FIG. 16 shows memory arrays MAs arranged to be aligned in the row direction. The arrangement of the memory arrays is duplicated in the column direction. A word line 78 is commonly provided to memory arrays MAs aligned in the row direction. Word line 78 includes gate electrode layer 72 and low-resistance conductive layer 74 shown in FIG. 15. Gate electrode layer 72 and conductive layer 74 are electrically connected via a contact hole 77 in a word line shunt region 79 or a region between memory arrays adjacent to each other in the row direction. No memory cell is arranged in word line shunt region 79. Low-resistance conductive layer 74 and gate electrode layer 72 are electrically connected via contact hole 77 in word line shunt region 79. Therefore, it is enough that the positions of those layers are overlapped with each other in a planar layout in the word line shunt region. Low-resistance conductive layer 74 can be shifted on memory array MA as shown by the dashed line in the column direction, without affecting the layout of the gate electrode layer located at the lower layer. Accordingly, the word lines having the word line shunt structure are also implemented into the shift-aside structure similar to those of the first to the third embodiments to expand the width of desired signal/power supply voltage lines. Specifically, the same effect can be achieved by replacing the sub word line decoder arranging region in the first to the third embodiment with the word line shunt region.

As discussed above, according to the fourth embodiment, the width of required interconnection lines can be easily extended even if the word lines have the word line shunt structure, since the low-resistance conductive layer for decreasing the resistance of the word lines has the shift-aside structure.

(Other applications)

According to the description above, a main word line is driven to H level when selected, in the hierarchical word line structure formed of the main word line and the sub word line. However, the selected main word line may be selectively driven to L level by changing the structure of the sub word line driver. Although the sense amplifier groups having the shared sense amplifier structure are presented in the first embodiment, the structure thereof may be the alternately arranged shared sense amplifier structure or a simple shared sense amplifier structure. Further, the width of a signal interconnection line transmitting the bit line equalize instruction signal may be increased on one side of a sense amplifier band relative to the column direction, and the width of an interconnection line transmitting the sense power source voltage may be increased on the other side thereof. In this case, the power source voltage line shown in FIG. 13 may transmit only one of power supply voltage Vcc and ground voltage GND, sense power source voltage may be transmitted from a sense power source voltage line to a sense power source line different from a sense power source line having its width increased by shifting the main word line/low-resistance conductive layer in the width direction in the sense amplifier band.

According to the present invention, as described above, the shift-aside structure is applied to the column selection line or the row selection line to generate an empty region on a memory away. Accordingly, the width of a required interconnection line can be increased without increase in area of the memory array or the sense amplifier band and a desired signal/voltage can be stably transmitted at a high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a memory array including a plurality of memory cells arranged in rows and columns:
    a plurality of row selection lines arranged extending in a row direction over said memory array and each transmitting a signal for selecting a memory cell row in said memory array, said plurality of row selection lines including a plurality of row selection lines each of a shift-aside structure with a first portion extending in said row direction and a second portion arranged to be shifted in a column direction and connected to said first portion; and a signal interconnection line formed of an interconnection line of the same layer as a layer of said plurality of row selection lines, arranged extending in said row direction, adjacent to the row selection lines of said shift-aside structure, and transmitting a signal or voltage related to memory cell row selection, said signal interconnection line having a portion increased in width relative to the column direction in a region adjacent to said second portion of the row selection line of said shift-aside structure.

2. The semiconductor memory device according to claim 1, wherein said signal interconnection line is arranged extending in the row direction outside said memory array, and said portion having the width increased is arranged on said memory array.

3. The semiconductor memory device according to claim 1, wherein each of the memory cells includes a capacitor including a storage node storing information and a cell plate node facing to said storage node and receiving a prescribed voltage, and wherein said semiconductor memory device further includes a cell plate line opposite to said row selection lines with respect to said signal interconnection line, arranged extending in said row direction, and transmitting said prescribed voltage.

4. The semiconductor memory device according to claim 3, wherein said signal interconnection line includes a recessed region which is recessed toward said memory array in said portion having increased in width, and said cell plate line includes a protruding region formed at said recessed region.

5. The semiconductor memory device according to claim 4, wherein a contact hole for making an electrical connection with said cell plate node is formed at a portion where said protruding region is neighboring to said memory array.

6. The semiconductor memory device according to claim 4, wherein width of said protruding region is increased stepwise.

7. The semiconductor memory device according to claim 1, further comprising:

a plurality of bit lines arranged corresponding to said columns, each of said plurality of bit lines having memory cells of a corresponding column connected thereto; and a bit line voltage setting circuit activated in response to a signal transmitted on said signal interconnection line for setting said plurality of bit lines at a prescribed precharge voltage level.

8. The semiconductor memory device according to claim 1, further comprising a plurality of word lines arranged corresponding to said rows respectively, each of said plurality of word lines having memory cells of a corresponding row connected thereto, and each of said plurality of word lines electrically connected to a corresponding row selection line on an outside of said memory array.

9. The semiconductor memory device according to claim 1, further comprising:

a plurality of sub word lines arranged corresponding to said rows respectively, each of said plurality of sub word lines having memory cells of a corresponding row connected thereto; and a plurality of sub word line drivers arranged, on an outside of said memory array, corresponding to said plurality of sub word lines respectively for driving a corresponding sub word line to a selected state in response to at least a signal on a corresponding row selection line when the corresponding sub word line is arranged corresponding to an addressed row.

\* \* \* \* \*